US009478727B2

(12) United States Patent
Böse et al.

(10) Patent No.: US 9,478,727 B2
(45) Date of Patent: Oct. 25, 2016

(54) FLUOROSILICONE-BASED DIELECTRIC ELASTOMER AND METHOD FOR ITS PRODUCTION

(71) Applicant: Fraunhofer-Gesellschaft zur Förderung der angewandten Forschung e.V., Munich (DE)

(72) Inventors: Holger Böse, Würzburg (DE); Detlev Uhl, Kitzingen (DE); Raman Rabindranath, Köln (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 632 days.

(21) Appl. No.: 13/795,543

(22) Filed: Mar. 12, 2013

(65) Prior Publication Data
US 2013/0236730 A1    Sep. 12, 2013

(30) Foreign Application Priority Data

Mar. 12, 2012 (DE) .......... 10 2012 203 827
Jul. 12, 2012 (DE) .......... 10 2012 212 222

(51) Int. Cl.
*C08G 77/04* (2006.01)
*C08G 77/06* (2006.01)
(Continued)

(52) U.S. Cl.
CPC ......... *H01L 41/0815* (2013.01); *C09D 183/08* (2013.01); *H01B 3/46* (2013.01); *H01L 41/0471* (2013.01); *H01L 41/0478* (2013.01); *H01L 41/193* (2013.01); *H01L 41/27* (2013.01); *H01L 41/45* (2013.01); *B32B 7/02* (2013.01); *B32B 25/042* (2013.01); *B32B 25/20* (2013.01); *B32B 37/02* (2013.01); *B32B 37/144* (2013.01);
(Continued)

(58) Field of Classification Search
None
See application file for complete search history.

(56) References Cited

U.S. PATENT DOCUMENTS 4,513,115 A * 4/1985 Beers .............. C08L 83/04
                                              524/267
5,236,997 A * 8/1993 Fujiki .................. 524/731
(Continued)

FOREIGN PATENT DOCUMENTS

WO    WO 2011/009549    *  1/2011

OTHER PUBLICATIONS

Pelrine R. et al.: Electrostriction of Polymer Dielectrics with Compliant Electrodes as a Means of Actuation; Sensors and Actuators; A 64 (1998) 77-85.

*Primary Examiner* — Vivian Chen
(74) *Attorney, Agent, or Firm* — Gudrun E. Huckett

(57) ABSTRACT

A dielectric elastomer has a film that contains a fluorinated silicone elastomer and has two faces. A coating of a stretchable electrode material is applied to each one of the two faces. The fluorinated silicone elastomer has a modulus of elasticity of maximally 450 kPa. The fluorinated silicone elastomer is a three-dimensionally crosslinked, fluorinated, alkyl group-containing polysiloxane in combination with a fluorinated silicone oil. Alternatively, or in addition, the fluorinated silicone elastomer is a three-dimensional wide-mesh crosslinked, fluorinated, alkyl-group containing polysiloxane whose wide mesh property has been effected by a chain length extension by addition of a chain-shaped silicone molecule containing two Si—H groups to an alkenyl group-containing polysiloxane molecule.

11 Claims, 3 Drawing Sheets

(51) Int. Cl.
| | |
|---|---|
| C08G 77/12 | (2006.01) |
| C08G 77/18 | (2006.01) |
| C08G 77/24 | (2006.01) |
| C08L 83/08 | (2006.01) |
| C09D 183/08 | (2006.01) |
| H02N 2/00 | (2006.01) |
| H01L 41/04 | (2006.01) |
| H01L 41/08 | (2006.01) |
| H01L 41/18 | (2006.01) |
| H01L 41/193 | (2006.01) |
| H01L 41/27 | (2013.01) |
| H01L 41/35 | (2013.01) |
| H01L 41/45 | (2013.01) |
| B32B 7/02 | (2006.01) |
| B32B 25/04 | (2006.01) |
| B32B 25/20 | (2006.01) |
| B32B 37/02 | (2006.01) |
| B32B 37/14 | (2006.01) |
| B32B 37/24 | (2006.01) |
| H01B 3/46 | (2006.01) |
| H01L 41/083 | (2006.01) |
| H01L 41/047 | (2006.01) |
| C08G 77/20 | (2006.01) |

(52) U.S. Cl.
CPC ...... *B32B2037/243* (2013.01); *B32B 2250/03* (2013.01); *B32B 2250/248* (2013.01); *B32B 2250/40* (2013.01); *B32B 2307/20* (2013.01); *B32B 2307/202* (2013.01); *B32B 2307/204* (2013.01); *B32B 2307/51* (2013.01); *B32B 2383/00* (2013.01); *B32B 2457/00* (2013.01); *C08G 77/04* (2013.01); *C08G 77/06* (2013.01); *C08G 77/12* (2013.01); *C08G 77/18* (2013.01); *C08G 77/20* (2013.01); *C08G 77/24* (2013.01); *C08L 83/08* (2013.01); *H01L 41/04* (2013.01); *H01L 41/0477* (2013.01); *H01L 41/08* (2013.01); *H01L 41/083* (2013.01); *H01L 41/0805* (2013.01); *H01L 41/18* (2013.01); *H01L 41/35* (2013.01); *H02N 2/00* (2013.01); *Y10T 428/31663* (2015.04)

(56) References Cited

U.S. PATENT DOCUMENTS

| | | | | |
|---|---|---|---|---|
| 5,264,603 | A * | 11/1993 | Altes | C07F 7/0892 524/424 |
| 5,840,800 | A * | 11/1998 | Joffre | C08G 65/336 524/806 |
| 5,973,023 | A * | 10/1999 | Altes | C08K 3/22 523/122 |
| 6,343,129 | B1 * | 1/2002 | Pelrine et al. | 381/191 |
| 6,376,971 | B1 * | 4/2002 | Pelrine et al. | 310/363 |
| 6,433,465 | B1 * | 8/2002 | McKnight et al. | 310/339 |
| 6,479,610 | B1 * | 11/2002 | Singh et al. | 528/18 |
| 6,543,110 | B1 * | 4/2003 | Pelrine et al. | 29/25.35 |
| 6,545,384 | B1 * | 4/2003 | Pelrine et al. | 310/309 |
| 6,812,624 | B1 * | 11/2004 | Pei et al. | 310/309 |
| 7,034,432 | B1 * | 4/2006 | Pelrine et al. | 310/309 |
| 7,411,331 | B2 * | 8/2008 | Dubowsky et al. | 310/309 |
| 2001/0035723 | A1 * | 11/2001 | Pelrine et al. | 318/116 |
| 2003/0080442 | A1 * | 5/2003 | Unger | 257/787 |
| 2004/0232807 | A1 * | 11/2004 | Pelrine et al. | 310/800 |
| 2006/0055288 | A1 * | 3/2006 | Heinzmann et al. | 310/364 |
| 2007/0200467 | A1 * | 8/2007 | Heydt et al. | 310/800 |
| 2009/0227804 | A1 * | 9/2009 | Lai | C08G 18/10 549/215 |
| 2010/0154255 | A1 * | 6/2010 | Robinson et al. | 36/127 |
| 2011/0300393 | A1 * | 12/2011 | Iio et al. | 428/521 |
| 2012/0177934 | A1 * | 7/2012 | Vogel et al. | 428/457 |
| 2014/0207775 | A1 * | 7/2014 | Kittock et al. | 707/736 |

* cited by examiner

FLUOROSILICONE-BASED DIELECTRIC ELASTOMER AND METHOD FOR ITS PRODUCTION

BACKGROUND OF THE INVENTION

The invention relates to a dielectric elastomer, i.e., stretchable dielectric elastomer film that on both faces is provided with electrode layers. The material of the dielectric elastomers according to the invention is constructed from, or by the use of, fluorosilicone polymers and has a greatly improved actuation elongation.

Dielectric elastomers are comprised of stretchable elastomer films that on both faces are coated with electrodes that are also stretchable. Upon elongation, the electrodes must maintain their electric conductivity. Such dielectric elastomers can be used as actuators, as sensors, or also as generators.

When used as an actuator, between the electrodes an electric potential is applied that causes the elastomer film, also referred to as dielectric, to be compressed with respect to thickness by the electrostatic pressure and, due to the approximate constant volume, to be expanded with regard to its surface area at the same time. In sensor operation the capacitance of the dielectric elastomer that is behaving like a flexible capacitor is measured. Upon elongation of the film, the capacitance of the capacitor changes so that elongations, forces or pressures can be determined. In operation as a generator, electric charges are transferred onto the expanded or stretched capacitor film. After relaxation of the stretched film, the charges are removed again at a higher energy state so that a gain in electric energy results.

The important properties for technical utilization of the elastomer material are the hardness or the modulus of elasticity, the electric breakdown field strength as well as the dielectric permittivity. The modulus of elasticity should be very minimal for many applications so that, for example, high actuator elongations in the electric field can be achieved in actuator operation. The electric breakdown field strength should be as high as possible in order to be able to apply high electric potentials and to thereby increase the actuation force and actuation elongation. Also, a high dielectric permittivity has a positive effect because the actuation force and actuation elongation are increased for identically applied electric field strength.

Known elastomer materials that are utilized as dielectric of dielectric elastomers are silicones (primarily polydimethylsiloxane), acrylates, polyurethanes, fluoropolymers, polybutadiene, natural rubber and others. With regard to suitable moduli of elasticity, for such materials a very broad range of 0.1 to 10 MPa, preferably of 0.3 to 3 MPa is proposed in U.S. 2007/0200467 A1. This publication mentions also a commercially available fluorosilicone without however dealing with its specific modulus of elasticity. The publications "Micro Electro Mechanical Systems" by R. Pelrine et al., 1997, pp. 238-243, and "Materials Science and Engineering" by R. Pelrine et al., C11, pp. 89-100 (2000) disclose that this material has a Young's modulus of 0.5 MPa but exhibits problems with regard to homogeneity of the material.

Electroactive polymer fibers for use as artificial muscles are disclosed in U.S. 2009/0085444 A1.

The present invention has the object to provide an improved material for the dielectric of a dielectric elastomer that in particular has a high permittivity and thus enables a high actuator elongation.

SUMMARY OF THE INVENTION

Fluorosilicones have in comparison to nonfluorinated silicones the advantage of a significantly increased dielectric permittivity. The mechanical properties of the known materials are however unfavorable for use in dielectric elastomers because the elastomer material is relatively hard, i.e., has a high modulus of elasticity, as disclosed also in "Micro Electro Mechanical Systems" by R. Pelrine et al. cited above. With such fluorinated silicones only a few effective dielectric elastomer actuators can be produced that do not create a high actuator elongation. However, the inventors have surprisingly succeeded in finding a fluorinated silicone elastomer that, on the one hand, contains fluorinated alkyl groups that contribute to a high permittivity and at the same time have however a high modulus of elasticity of significantly less than 500 kPa in the unstretched state at room temperature.

This material is a three-dimensionally crosslinked, partially or completely fluorinated polysiloxane that, despite its three-dimensional crosslinking, surprisingly has a low modulus of elasticity. The latter should not surpass 450 kPa and preferably is significantly lower that this value, for example, lower than 400 kPa or even lower than 350 kPa.

The material according to the invention can be obtained in various ways. In a first embodiment of the invention, for this purpose a three-dimensionally crosslinked alkyl group-containing polysiloxane whose alkyl groups are at least partially fluorinated is combined with a fluorinated silicone oil. As a fluorinated silicone oil primarily a low-viscosity, in general linear, oligosiloxane or polysiloxane with alkyl groups that are partially or completely fluorinated is suitable. In a second embodiment of the invention, a three-dimensionally crosslinked but particularly wide-mesh alkyl group-containing polysiloxane is provided whose alkyl groups are at least partially fluorinated.

For each one of the two embodiments it is preferred that the crosslinking of the respective polysiloxanes is done by means of an additional reaction, in which the Si—H groups are reacting with C=C double bonds in residues that are bonded by means of a carbon to the silicon, for example, alkenyl silanes (e.g. allyl or vinyl silanes). In this context, the advantages reside in that, on the one hand, the reaction does not produce low-molecular by-products as would be the case in condensation reactions and that, on the other hand, the siloxanes produced by such an addition crosslinking reaction are not subjected to shrinkage, or only to minimal shrinkage.

In a particular embodiment of the invention, both variants are combined with each other such that a particularly wide-mesh crosslinked polysiloxane is combined with the silicone oil.

In the first embodiment of the invention, it is preferred when the three-dimensional crosslinking of the precursor material for the crosslinked polyalkylsiloxane is realized in the presence of silicone oil. With these measures, the preparation of a homogenous material is favored.

In the second embodiment of the invention, the wide-mesh property of the polysiloxane is effected in that particularly long polysiloxane chains are generated which will be explained in more detail infra.

The three-dimensionally crosslinked, partially or completely fluorinated polysiloxane has in all cases preferably long chains, in particular with a building block —Si(W)(W')—O— wherein W and W' are the same or different, W is an at least partially fluorinated, short-chain to long-chain alkyl (for example, $C_1$ to $C_{10}$ alkyl) and W' either has the same meaning as W or is a nonfluorinated, short-chain to long-chain alkyl (for example, $C_1$ to $C_{10}$ alkyl). The aforementioned preferably long chains can be comprised of this building block with the exception of the terminal groups. Alternatively, they contain the building block in a proportion of at least 50%, preferably of at least 90% (relative to the number of building blocks with one Si atom, respectively). Preferably, both ends of the chains (in specific cases moreover also further locations within the molecule, which however should be realized only in rare situations because of the desired softness of the product) are bonded by linking groups in such a way to further silane units or siloxane units that a three-dimensional network is formed. It is especially preferred that these are optionally alkylated ethylene groups. These are preferably derived from C=C double bond containing terminal groups (or optionally additional C=C double bond containing groups) of the corresponding long chains, for example, alkenyl (e.g. vinyl or allyl) groups that have reacted, for example, with Si—H groups of further silane units or siloxane units. This classical silicone rubber reaction is preferred particularly also because exclusively alkylene groups are produced; instead, for the aforementioned crosslinking, other coupling or addition polymerization reactions can be employed also that are known to a person of skill in the art.

Of the siloxanes that are used for these crosslinking reactions as starting materials, in a preferred way at least one has a molecular weight of at least 10,000 g/mol, even more preferred of at least 20,000 g/mol and in particularly preferred at least 40,000 g/mol so that the long chains of the three-dimensionally crosslinked polysiloxane can be generated in the reaction. In a favorable embodiment of the invention, these siloxanes are chain-shaped molecules (chain molecules) with the afore described terminal groups, referred to also as "long-chain polysiloxane".

In order to crosslink the aforementioned linear polysiloxane chains, a silane or siloxane is used that has more than two, preferably three, reactive groups that can react with the terminal groups of the chain-shape molecules. Beneficial for this purpose are the aforementioned Si—H groups. The crosslinking agent, like the chain-shape polysiloxane, can comprise building blocks —Si(W)(W')—O— wherein W and W' have the same meaning as indicated above. A further example for such a crosslinking agent (crosslinker) is tris (dialkylsiloxy)silane, for example, a tris(dimethylsiloxy) silane that, in turn, is preferably partially or completely fluorinated. A concrete example for this is trifuroropropyl tris(dimethylsiloxy)silane. In specific cases, the crosslinking agent can also carry still more than three, namely for example, four reactive groups; however, because of the goal of generating a material that is as soft as possible, this will be the exception.

In order to generate a particularly wide-mesh polysiloxane, the chains of the preferably already long-chain polysiloxane can be extended further in particular for example by reacting them with a silane or siloxane that has one or two, preferably two, reactive groups that can react with the terminal groups of the chain-shaped molecule. Again, beneficial are Si-H groups for this purpose. Like the chain-shaped polysiloxane, the extension means can comprises building blocks —Si(W)(W')—O— wherein W and W' have the same meaning as indicated above. Another example for such an extension means is bis(dialkylsiloxy)silane, for example, a bis(dimethylsiloxy)silane that in turn is preferably partially or completely fluorinated. A concrete example for this is trifluoropropyl bis(dimethylsiloxy)silane.

Depending on the intended crosslinking/extension reaction, to the mixture of the starting materials a suitable catalyst can or must be added. In case of crosslinking by reaction of vinyl groups with Si—H groups, this is in general a platinum-containing material, for example, the so-called Karstedt catalyst that is obtainable commercially and that enables crosslinking at room temperature.

When the chains of the three-dimensional crosslinked, partially or completely fluorinated polysiloxane is not exclusively built of building blocks —Si(W)(W')—O—, they can additionally have building blocks $Si(W'')_2$—O— in which W" is a nonfluorinated alkyl group with, for example, $C_1$ to $C_{10}$ alkyl. Mixed building blocks Si(W)(W')—O— in which W' is a fluorinated alkyl group are possible also. The distribution of the different substituents can follow a regular pattern; in general, it is statistical.

As partially fluorinated groups, for example, trifluoropropyl and longer chain groups such as trifluorooctyl groups are conceivable wherein trifluoropropyl groups are preferred. As a completely fluorinated group, for example, trifluoromethyl groups are conceivable. As nonfluorinated alkyl groups, methyl, propyl, and octyl groups are preferred. The respective selection of groups can be left to a person skilled in the art inasmuch as it is ensured that a sufficient fluorine contents in material is existing. For this purpose, it is beneficial when at least 10%, preferably at least 20%, and in particular preferred at least 40%, of the sidechains in the building blocks have the above meaning of W which, in general, contain at least one $CF_3$ group and optionally additionally $CF_2$ groups. The same or comparable features applied to the chain length extension agent and crosslinking agent.

The molecules of the silicone oil comprise oligoalkylsiloxanes or polyalkylsiloxanes with building blocks —Si(W) (W')—O— optionally in combination with building blocks —Si(W")$_2$—O as defined above. Preferably, their chain is comprised of the building blocks —Si(W)(W')—O— but in general they do not have reactive terminal groups. Their terminal groups can be instead optionally partially or completely fluorinated alkyl groups, as indicated above for the substituent W', or nonfluorinated alkyl groups, as defined above for W'. It is preferred when the chain-shaped polysiloxane and the silicone oil have approximately the same fluorination degree because then the compatibility between these materials is especially good, which favors preparation of a homogenous mixture, and because then they have moreover approximately the same dielectric permittivity.

The oligoalkylsiloxanes and/or polyalkylsiloxanes of the silicone oil have a molecular weight of at least approximately 500 g/mol, preferably of at least 750 g/mol and most preferred of at most approximately 1,500 g/mol. As a result of the minimal molecular weight the silicone oil is liquid to pasty. Preferably, it has a viscosity of 50 $mm^2$/s to 150 $mm^2$/s (50 cSt to 150 cSt), especially preferred of 80 $mm^2$/s to 120 $mm^2$/s.

In the fluorinated silicone elastomer, the mass ratios of fluorinated, three-dimensional crosslinked polysiloxane relative to silicone oil, also fluorinated, are preferably at approximately 10:1 to 1:5 and more preferred at approximately 5:1 to approximately 1:1. The wider the meshes of the three-dimensionally crosslinked polysiloxane, the less silicone oil is required; optionally, in the above described second embodiment, is can be omitted entirely.

In one particular embodiment of the invention that can be combined with any of the other embodiments, the fluorinated silicone elastomer contains a filler. The latter is preferably selected from electrically polarizable particles such as barium titanate, lead zirconate titanate or titanium dioxide and/or electrically conductive particles of carbon such as graphite, graphenes or carbon nano tubes and/or metals such as iron, copper, silver or gold, and/or conductive polymers such as polyaniline, polyacetylene, polypyrrole, polyparaphenylene or polythiophene and is provided for increasing the permittivity. Among the aforementioned materials, electrically polarizable particles are preferred; when conductive particles or conductive polymers are to be used, attention should be paid that they are contained in a sufficiently minimal concentrations such that they are embedded in the silicone elastomers without contact with each other in order to avoid any possibility for short-circuiting between the electrode films on both faces. Instead, or in addition, in particular the electrically conductive particles can be provided with an insulating coating.

The invention provides in a surprising way a homogenous material as a starting materials for the dielectric elastomer even though almost no other liquids can be mixed with the chemical precursor stages of fluorinated silicone elastomer. By fluorination, the dielectric permittivity relative to non-fluorinated silicone elastomer increases. With the addition of fluorinated silicone oil or by providing wide meshes, the fluorinated silicone elastomer becomes softer. Both effects together cause a significant improvement of the properties of the dielectric elastomer. The improvement is expressed in an increased actuator force and an increased actuation elongation of the dielectric elastomer actuators.

The dielectric elastomers of fluorinated silicone elastomers of the present invention have relative to nonfluorinated silicone elastomers a significantly increased dielectric permittivity. By addition of fluorinated silicone oil or the mesh enlargement the modulus of elasticity can be greatly lowered. It has a value of at most 450 kPa, preferably of at most 300 kPa, even more preferred of at most 200 kPa and in particular preferred of at most 100 kPa for an elongation of 100%, i.e., the material is becoming very soft. At the same time, in respect to actuator action, the dielectric elastomer expands at significantly lower field strengths. Accordingly, dielectric elastomer actuators can be produced that, in comparison to those of nonfluorinated silicone elastomer, have a greatly increased actuation elongation. Corresponding advantages also exists for dielectric elastomer sensors (higher sensitivity) and for dielectric elastomer generators (higher energy density). These properties can be seen in the attached Figures. FIG. 5 shows the modulus of elasticity for a nonfluorinated silicone elastomer in comparison to a fluorinated silicone elastomer of the invention. The modulus of elasticity of the fluorinated silicone elastomer is significantly smaller. FIG. 6 shows the actuation elongation of a nonfluorinated silicone elastomer in comparison to a fluorinated silicone elastomer of the invention. The actuation elongation of the fluorinated silicone elastomer is significantly greater.

The afore described fluorinated silicone elastomer is brought (for example, by spraying or by applying with a doctor blade) into the shape of a film (of the dielectric) for producing a dielectric elastomer, for example by application of the not yet crosslinked mixture of the starting materials, optionally in the presence of the required catalyst, onto a substrate, such as a substrate film, with bad adhesion properties and is then crosslinked, for example, by heating. The conditions should be selected preferably such that the produced dielectric film after crosslinking has a thickness of less than 1 mm, even more preferred of less than 500 micrometer, and particularly preferred of less than 250 micrometer.

For producing the dielectric elastomer, this film is removed from its substrate and is provided on both faces with an electrode layer. The latter contains preferably conductive particles of carbon (e.g. graphite, graphenes, carbon nano tubes) and/or metals (e.g., aluminum, iron, copper, silver, gold) that preferably by means of a binder are glued to each other, wherein the binder beneficially also adheres to the silicone elastomer film. Instead, the electrode layers can also be prepared from, or with, a conducting polymer such as polyaniline, polyacetylene, polypyrrole, polyparaphenylene, PEDOT:PPS (that is: poly-3,4-ethylene dioxythiophene: polystyrene sulfonate, a doped conductive conjugated polymer whose thiophene groups partially carry a positive charge which is compensated by the polymer counter ion PSS) or polythiophene.

In a particularly preferred embodiment, the conductive particles of the electrode layer have an anisotropic form and are comprised of metal or have a metallic coating. Because of the anisotropic form of the conductive particles, already with relatively low volume proportions high conductivities can be obtained. Also, the contact between the particles upon elongation of the electrode layer is not lost that easily.

The form of the particles can be selected as desired, for example, from flakes (regular or irregular platelets, having a diameter in the x-y plane that is greater than in the z direction), regular or irregular rods or fibers.

As a core of coated particles, basically any material can be used. Beneficial are non-conducting inorganic materials, for example, glass; but also organic materials (in particular plastic material) or metal can be used. In a specific embodiment silver-coated flakes with a core of glass or of copper are employed.

The invention also provides a multilayer system, comprising a dielectric elastomer as described above, wherein at least on one of the coatings of a stretchable electrode material one or several double layer(s) is/are applied that is comprised of a further layer of a fluorinated silicone elastomer with a modules of elasticity of maximally 450 kPa and a further coating of a stretchable electrode material, such that two coatings each of a stretchable electrode material are separated from each other by a layer of a fluorinated silicone elastomer, and vice versa, wherein the coatings of the expandable electrode material alternatingly can be or are switched as a positive electrode and a negative electrode. By this arrangement, the described effects can be amplified substantially or can be multiplied.

The electrode layers (coatings) can optionally also be covered by a layer of an insulation material in order to make handling of the dielectric elastomer safe.

In a preferred embodiment of the invention, the electrode layers (coatings) are produced by use of a silicone elastomer that is also at least partially fluorinated, wherein especially preferred the same or a very similar material is employed as it is used for the dielectric that is located between the electrodes. It can be filled with the above mentioned conductive particles such as carbon or metal particles. The proportion of conductive particles is in this connection preferably between 20% by mass and 70% by mass, preferably between 25% by mass to 65% by mass. This embodiment is particularly preferred because the use of a similar or identical silicone elastomer for the dielectric film as well as for electrodes on two sides has the effect that the elongation of the materials is comparable. Moreover, such electrode layers are adhering particularly well on the dielectric because their material before crosslinking carries groups which can react with the dielectric.

Possible applications of the inventions are:
dielectric elastomer actuators, for example, as linear actuators for mirrors or flaps, for pump drives, or for haptic operator surfaces;
dielectric elastomer sensors, for example, as elongation sensors, as force sensors or pressure sensors;
dielectric elastomer generators, for example, for mobile energy generation.

DESCRIPTION OF THE PREFERRED EMBODIMENTS

In the following, the invention will be explained in more detailed with the aid of embodiments.

Figure 1:
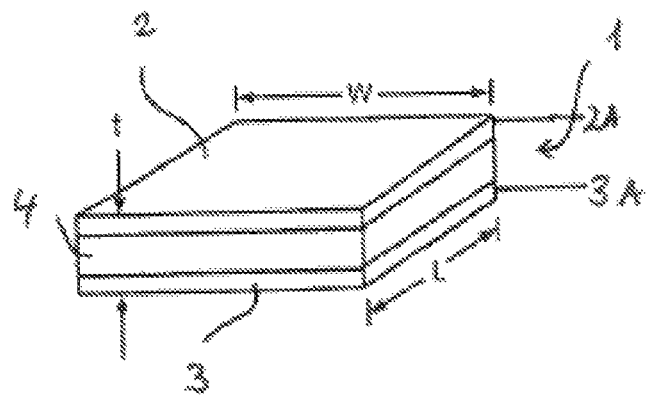
FIG. 1 is a schematic illustration of the dielectric elastomer according to the invention comprised of a fluorinated silicone elastomer film (dielectric) and of a first coating and a second coating each comprised of a stretchable electrode material.

FIG. 1 shows schematically a dielectric elastomer 1 according to the invention comprised of, or containing, a fluorinated silicone elastomer film (dielectric) 4 and a first coating 2 and a second coating 3, each coating 2, 3 comprised of a stretchable electrode material. For example, the first coating 2 is positive and the second coating 3 is negative. The letter L indicates the length, the letter W the width, and the letter t the depth or height of the dielectric elastomer 1 according to the invention. When an electric potential is applied to the two coatings 2, 3 of electrode material, the film 4 is compressed in the direction of depth t by the electrostatic pressure and this causes elongation (expansion) in the direction of length L and width W, i.e. the surface area is enlarged. The two coatings 2, 3 of electrode material must follow this elongation or stretching because the coatings 2, 3 are fixedly attached to the film 4. The elongation as described causes the film 4 as well as the coatings 2, 3 to reduce their thickness so that the depth t is reduced.

Figure 2:
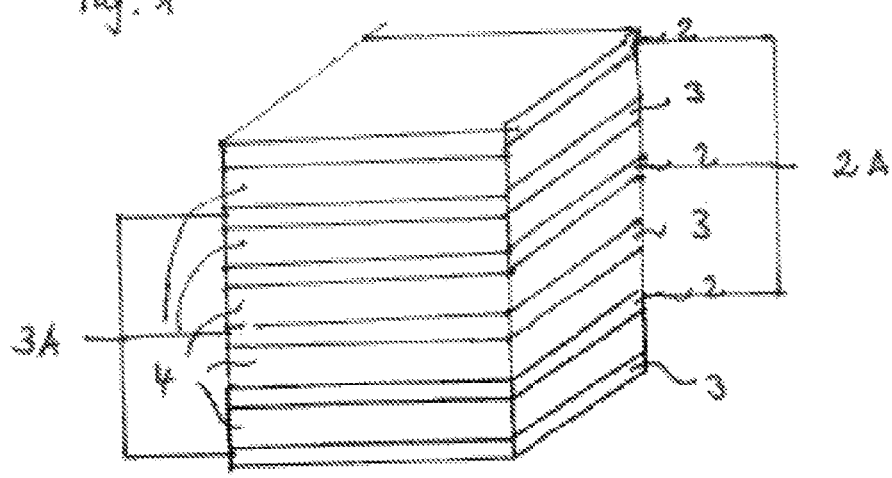
FIG. 2 shows an alternating arrangement of the electrodes with interposed dielectric film and with conductors.

FIG. 2 shows an alternating arrangement of the electrodes (coatings 2, 3) with interposed dielectric film 4 and with electric conductors connected to the electrodes (coatings 2, 3). The conductors of each coating 2 or 3 of the same type are combined to a common conductor 2A or 3A so that the conductors of the same electrode type can be supplied with electric current at once in order to effect e.g. the actuator action.

Figure 3:
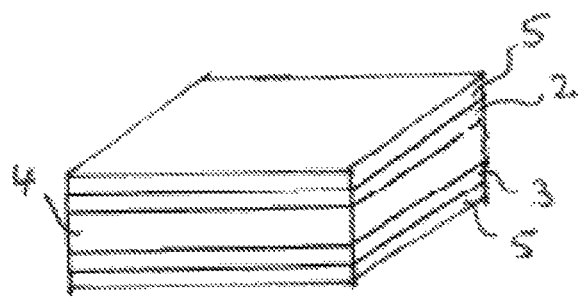
FIG. 3 shows the dielectric elastomer of FIG. 1 with insulation layers.

FIG. 3 shows that the dielectric elastomer 1 of FIG. 1 is provided with insulation layers for improved handling.

Figure 4:
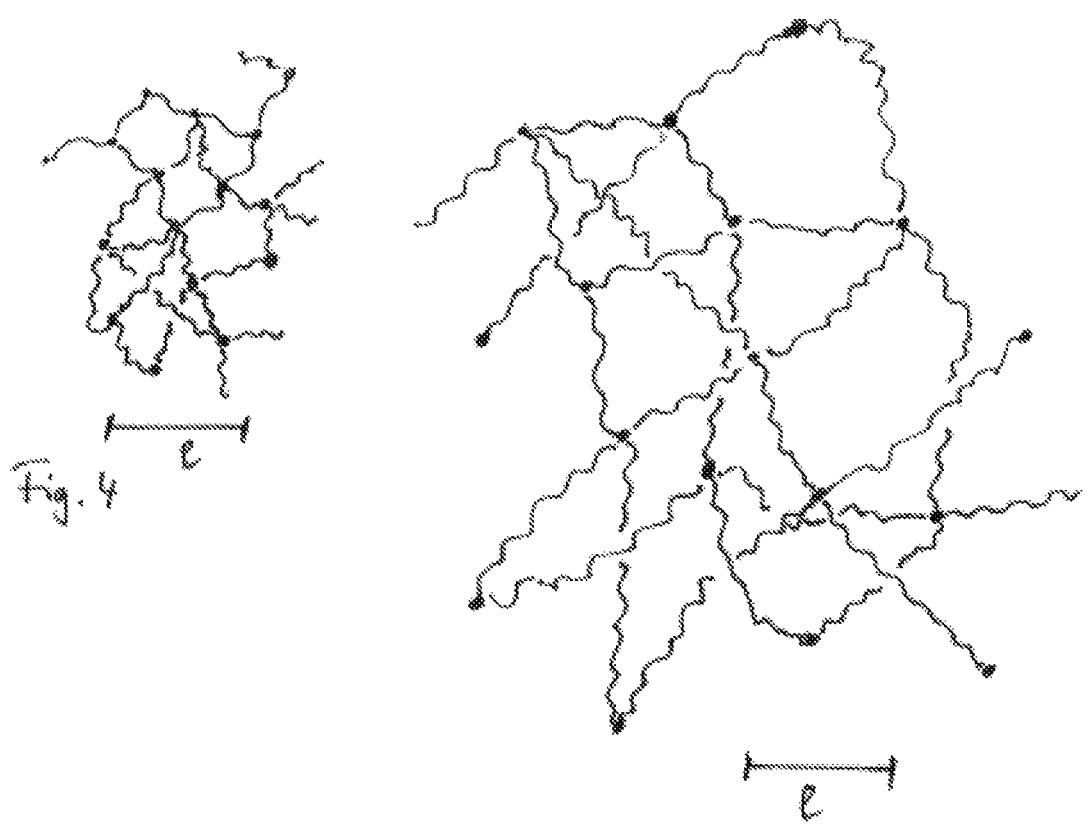
FIG. 4 shows purely schematically for an arbitrary unit of length l on the left hand side a three-dimensionally crosslinked structure with a tight or narrow mesh width and on the right hand side a three-dimensionally crosslinked structure with a wide mesh width.

FIG. 4 shows purely schematically, for illustration purposes only, for an arbitrary unit of length l on the left hand side a three-dimensionally crosslinked polysiloxane structure with a tight or narrow mesh width and on the right hand side a three-dimensionally crosslinked polysiloxane structure with a wide mesh width in accordance with the present invention.

Figure 5:
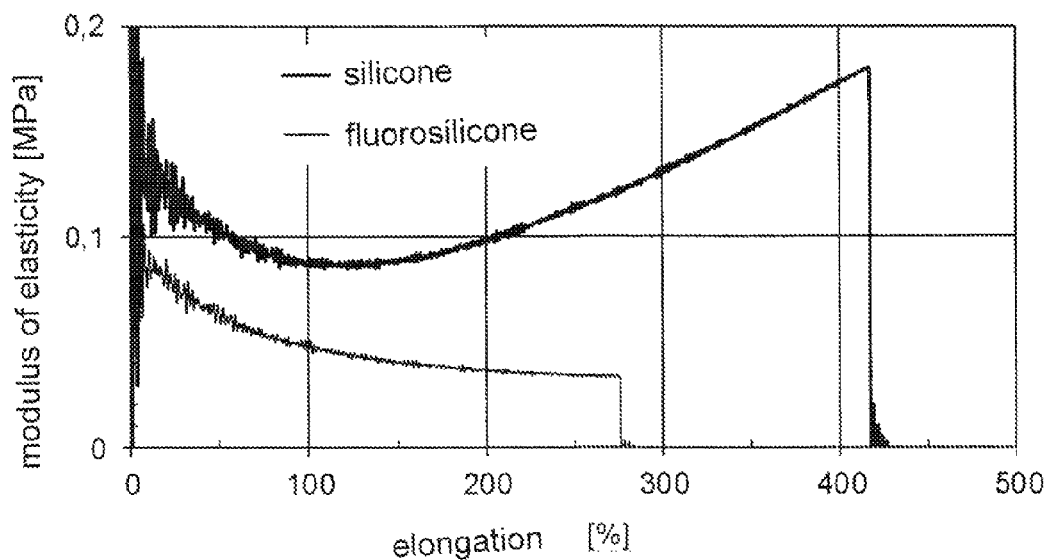
FIG. 5 is a graph showing the modulus of elasticity plotted against the elongation for silicone (thick line) and fluorosilicone (thin line); the modulus of elasticity of the fluorinated silicone elastomer is significantly smaller.

FIG. 5 is a graph showing the modulus of elasticity plotted against the elongation for silicone (thick line) and fluorosilicone (thin line); the modulus of elasticity of the fluorinated silicone elastomer is significantly smaller.

Figure 6:
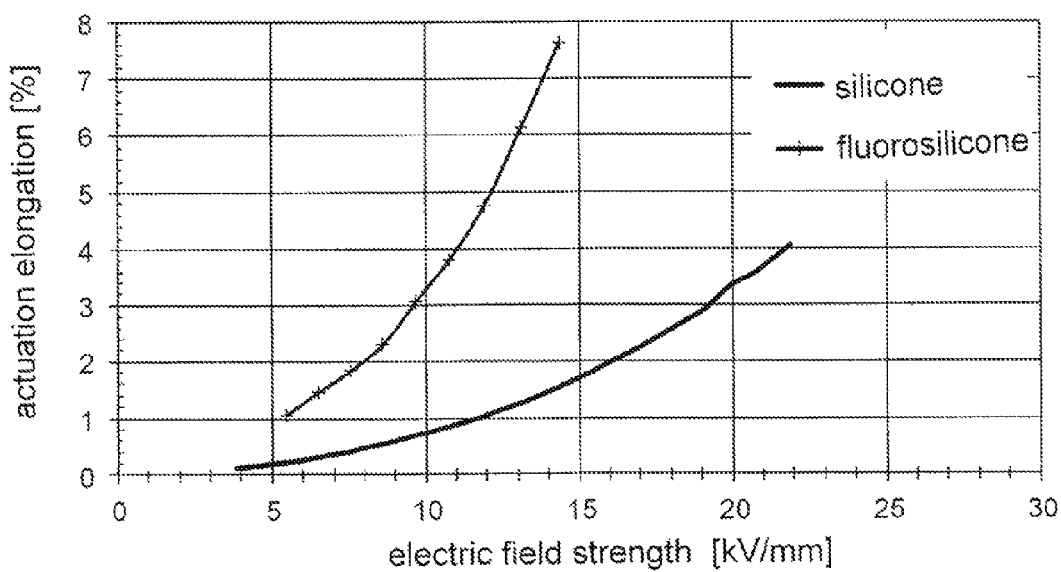
FIG. 6 is a graph showing the actuation elongation plotted against the electric field strength for silicone (thick line) and fluorosilicone (thin line); the actuation elongation of the fluorinated silicone elastomer is significantly greater.

FIG. 6 is a graph showing the actuation elongation plotted against the electric field strength for silicone (thick line) and fluorosilicone (thin line); the actuation elongation of the fluorinated silicone elastomer is significantly greater.

Material Example 1

Fluorinated divinyl(polysiloxane) copolymer (49.71 g) whose silicon atoms carry partially trifluoropropyl groups and partially methyl groups was mixed with 0.24 g of trifluoropropyl tris(dimethylsiloxy)silane and 45 g of fluorinated silicone oil whose silicon atoms also carry partially trifluoropropyl groups and partially methyl groups and that has a viscosity in the range of approximately 100 mm$^2$/s, in the presence of Karstedt catalyst with the aid of a centrifugal mixer. For producing an elastomer film with defined layer thickness, this fluorinated silicone mixture was applied with the aid of a gap-type doctor blade (squeegee) on a planar substrate as a uniform film. By heating with an infrared radiator the silicone film was crosslinked.

The modulus of elasticity of the obtained film was determined by a tensile elongation measurement. FIG. 5 shows the modules of elasticity of the film (curve "fluorosilicone"). At the beginning of the measurement, the modules of elasticity was at approximately 100 kPa and at an elongation of 100% at approximately 50 kPa. For determining the modulus of elasticity, sample bodies (0.25 mm×10 mm×50 mm) were cut from a film produced by doctor blade application and measured by means of a tensile testing machine Zwicki 1120 of the company Zwick, Ulm Germany. The tensile test was carried out at a pulling speed of 120 mm/min. The moduli of elasticity which are indicated in the instant application, in case of any doubt, relate to a measurement as described herein and preferably relate to the value that applies to 100% elongation.

Material Example 2

Example 1 was repeated with the proviso that instead of 45 g of fluorinated silicone oil trifluoropropyl bis(dimethylsiloxy)silane was used in a quantity that is equimolar to that of divinyl(polysiloxane) copolymer.

Material Example 3

Example 1 was repeated with the proviso that in addition to the fluorinated silicone oil trifluoropropyl bis(dimethylsiloxy)silane was used in a quantity that is equimolar to that of divinyl(polysiloxane) copolymer.

Examples 1 to 3

For producing a dielectric elastomer actuator, the respective elastomer film was coated on both faces with flexible electrodes. As electrode material a mixture of 75% by mass of the above described fluorosilicones elastomer with 25% by mass of graphite particles was used. The elastomer coating was done by means of an airbrush pistol.

The actuation elongation of elastomer actuators with the material of the example 1 at different field strengths is shown in FIG. 6 (curve "fluorosilicone").

In summarizing the above, the invention concerns the following partially basic and partially preferred embodiments.

A. A dielectric elastomer, comprising a film that contains or is comprised of a fluorinated silicone elastomer as well as, on both faces of the film, a coating of stretchable electrode material, or comprised of these components, characterized in that the fluorinated silicone elastomer has a modulus of elasticity of maximally 450 kPa.

B. A dielectric elastomer as defined under A, characterized in that the fluorinated silicone elastomer comprises a three-dimensionally crosslinked, fluorinated, alkyl group-containing polysiloxane in combination with a fluorinated silicone oil and/or in that the fluorinated silicone elastomer comprises a three-dimensional wide-mesh crosslinked, fluorinated alkyl-group containing polysiloxane whose wide mesh property has been effected by a chain length extension by addition of a chain-shaped silicone molecule that contains two Si—H groups to a polysiloxane molecule that contained alkenyl groups, in particular vinyl group.

C. A dielectric elastomer as defined under B, wherein the silicone oil has a viscosity of no more than 150 mm$^2$/s.

D. A dielectric elastomer as defined under B or C, wherein the proportion of the fluorinated silicone oil in the fluorinated silicone elastomer is at least 10% by mass, preferably at least 25% by mass, and in particular preferred at least 40% by mass.

E. A dielectric elastomer as defined under B, C, or D, wherein the degree of fluorination of the fluorinated silicone oil corresponds to that of the three-dimensionally crosslinked fluorinated alkyl group-containing polysiloxane, or deviates maximally +/−10% from it, relative to the number of fluorinated alkyl groups in the respective materials.

F. A dielectric elastomer as defined above in one of the items A to E, wherein the fluorinated silicone elastomer has been prepared by reaction of a long-chained fluorinated dialkenyl(polysiloxane) copolymer with two, or more than two, reactive groups with a fluorinated silane-containing crosslinker that contains three, or more than three, reactive groups or wherein the fluorinated silicone elastomer has been prepared by the reaction of a long-chained fluorinated dialkenyl(polysiloxane) copolymer with three, or more than three, reactive groups with a fluorinated siloxane that contains two, or more than two, reactive groups.

F'. A dielectric elastomer as defined in item F, wherein the alkenyl groups are selected from vinyl and allyl groups and in particular are vinyl groups.

G. A dielectric elastomer as defined under F or F', wherein the long-chain fluorinated dialkenyl(polysiloxane) or divinyl (polysiloxane) copolymer carries no more than two reactive groups and the fluorinated silane-containing crosslinker carries no more than three reactive groups, or wherein the long-chain fluorinated dialkenyl(polysiloxane) or divinyl (polysiloxane) copolymer carries no more than three reactive groups and the fluorinated siloxane no more than two reactive groups.

H. A dielectric elastomer as defined under B, F, or G, wherein the alkenyl group-containing or vinyl group-containing polysiloxane molecule is a long-chain fluorinated divinyl(polysiloxane) copolymer with a molecular weight of at least 10,000 g/mol, preferably at least 20,000 g/mol, and in particular preferred at least 40,000 g/mol.

I. A dielectric elastomer as defined under F to H, wherein the fluorination degree of the long-chain fluorinated dialkenyl(polysiloxane) or divinyl(polysiloxane) copolymer is at least 10%, preferably at least 20%, and in particular preferred at least 40%, and/or wherein 10%, 20%, or 40% of the hydrocarbon side groups at the Si atoms are fluorinated.

J. A dielectric elastomer as defined above in one of the items A to I, wherein the fluorinated silicone elastomer contains trifluoropropyl groups and/or tridecafluorooctyl groups.

K. A dielectric elastomer as defined above in one of the items A to J, wherein the fluorinated elastomer was prepared by crosslinking of a fluorinated divinyl(polysiloxane) copolymer with trifluoropropyl tris(dimethylsiloxy)silane, optionally with extension of the polymer chains by addition of difluoropropyl bis(dimethylsiloxy)silane.

L. A dielectric elastomer as defined above in one of the items A through K, wherein the modulus of elasticity of the fluorinated silicone elastomer is at most 300 kPa, preferably at most 200 kPa, and particularly preferred at most 100 kPa.

M. A dielectric elastomer as defined above in one of the items A through L, wherein the fluorinated silicone elastomer contains electrically polarizable particles, preferably of barium titanate, lead zirconate titanate, or titanium dioxide and/or electrically conductive particles of carbon, preferably graphite, graphenes or carbon nano tubes; metals, preferably aluminum, iron, copper, silver or gold; or a conductive polymer, preferably polyaniline, polyacetylene, polypyrrole, polyparaphenylene or polythiophene, wherein the electrically conductive particles can be provided with an insulating coating.

N. A dielectric elastomer as defined above in one of the items A through M, wherein the elastomer film has a thickness of less than 1 mm, preferably less than 500 micrometer, especially preferred less than 250 micrometer, and/or the electrodes have a thickness of less than 100 micrometer, preferably less than 50 micrometer, and especially preferred less than 25 micrometer.

O. A dielectric elastomer as defined above in one of the items A through N, wherein the coating provided on both sides and comprised of a stretchable electrode material contains conductive particles of carbon, preferably graphite, graphenes or carbon nano tubes; metal, preferably aluminum, iron, copper, silver or gold; or a conductive polymer, preferably polyaniline, polyacetylene, polypyrrole, polyparaphenylene, PEDOT:PSS, or polythiophene, embedded in an organic matrix of identical or different material.

P. A multilayer system comprising a dielectric elastomer as defined above in one of the items A through O, characterized in that at least on one of coatings of a stretchable electrode material one or several double layer(s) is/are applied that are comprised of a further layer of fluorinated silicone elastomer with a modulus of elasticity of maximally 450 kPa and a further coating (or layer) of a stretchable electrode material such that two coatings each of a stretchable electrode material are separated from each other by a layer of fluorinated silicone elastomer and vice versa, wherein the coatings of a stretchable electrode material can be switched or are switched alternatingly as a positive electrode and as a negative electrode.

Q. A dielectric elastomer as defined above in one of the items A to O, or a multi-layer system as defined under P, further comprising an insulation layer on each one of the outwardly positioned coatings of a stretchable electrode material.

R. A dielectric elastomer as defined above in one of the items A to O and Q, or a multilayer system as defined under P or Q, wherein each layer of electrode material is contacted with an electric supply line (conductor).

S. The use of a dielectric elastomer or a multilayer system as defined under R, defined as an dielectric elastomer actuator, dielectric elastomer sensor or dielectric elastomer generator.

i. A method for producing a dielectric elastomer as defined above in one of the items A to O, comprising the following steps:
(a) providing an at least partially fluorinated polysiloxane that carries at least two reactive groups,
(b) providing an at least partially fluorinated silane or polysiloxane that carries at least three groups that can react with a reactive group of the at least partially fluorinated polysiloxane according to (a),
with the proviso that either the polysiloxane carrying at least two reactive groups according to (a) or the silane or polysiloxane carrying at least three reaction-capable groups according to (b) has a molecular weight of at least 10,000 g/mol,
(c) mixing of the polysiloxane according to (a), the silane or polysiloxane according to (b), a silicone oil as well as optionally a catalyst,
(d) layered application of the mixture produced according to (c) on a substrate,
(e) effecting the reaction of the reactive groups in the mixture by light and/or heat and/or the addition of a catalyst, with formation of a stable film,
(f) removing the film from the substrate,
(g) producing one or several mixtures comprising the materials mentioned in (c) as well as an electrically conductive powder,
(h) applying a mixture according to (g) on a face of the film and either the same mixture or a different mixture according to (g) onto the other face of the film, and
(i) effecting the reaction of the reactive groups in the mixture by light and/or heat and/or the addition of a catalyst.

ii. A method for producing a dielectric elastomer as defined above in one of the items A to O, comprising the following steps:
(a) providing an at least partially fluorinated polysiloxane that carries at least two reactive groups,
(b) providing an at least partially fluorinated silane or polysiloxane that carries three or more groups that can react with a reactive group of the at least partially fluorinated polysiloxane according to (a),
(c) providing an at least partially fluorinated silane or polysiloxane that carries no more than two groups that can react with a reactive group of the at least partially fluorinated polysiloxane according to (a),
with the proviso that at least one polysiloxane according to (a), (b) or (c) is provided that has a molecular weight of at least 10,000 g/mol,
(d) mixing of the polysiloxane according to (a), the silane or polysiloxane according to (b), the silane or polysiloxane according to (c), as well as optionally a catalyst,
(e) layered application of the mixture produced according to (d) on a substrate,
(f) effecting the reaction of the reactive groups in the mixture by light and/or heat and/or the addition of a catalyst, with formation of a stable film,
(g) removing the film from the substrate,
(h) producing one or several mixtures comprising the materials mentioned in (d) as well as an electrically conductive powder,
(i) applying a mixture according to (h) on a face of the film and either the same mixture or a different mixture according to (h) onto the other face of the film, and
(k) effecting the reaction of the reactive groups in the mixture by light and/or heat and/or the addition of a catalyst.

iii. A method as described under i above, wherein in the step (c) in addition at least one partially fluorinated silane or siloxane is added that carries no more than two groups that can react with a reactive group of the at least partially fluorinated polysiloxane according to (a).

iv. A method as defined under ii above, wherein in the step (d) in addition a silicone oil is added.

v. A method as defined under any of the items i. to iv. above, wherein the least two reactive groups of the at least partially fluorinated polysiloxane according to (a) contain C=C double bonds that are preferably vinyl groups while the reactive groups of the silane or polysiloxane carrying at least three such groups according to (b) and optionally of the silane or polysiloxane carrying no more than two such groups according to (c) are Si—H groups.

The specification incorporates by reference the entire disclosure of German priority documents 10 2012 203 827.2 having a filing date of Mar. 12, 2012 and 10 2012 212 222.2 having a filing date of Jul. 12, 2012.

While specific embodiments of the invention have been shown and described in detail to illustrate the inventive principles, it will be understood that the invention may be embodied otherwise without departing from such principles.

What is claimed is:

1. A dielectric elastomer comprising:
a film that contains or is comprised of a fluorinated silicone elastomer and has two faces;
a coating of a stretchable electrode material applied to each one of the two faces;
wherein the fluorinated silicone elastomer has a modulus of elasticity of maximally 450 kPa;
wherein the fluorinated silicone elastomer comprises a three-dimensionally crosslinked, fluorinated, alkyl group-containing polysiloxane in combination with a fluorinated silicone oil and/or wherein the fluorinated silicone elastomer comprises a three-dimensional crosslinked, fluorinated, alkyl-group containing polysiloxane that comprises a chain length extension, obtained by addition of a chain-shaped silicone molecule to an alkenyl group-containing polysiloxane molecule, wherein the chain-shaped silicone molecule is selected from the group consisting of:
(i) silicone molecules that contain two Si—H groups and that further contain building blocks —Si(W)(W')—O—, wherein W and W' are the same or different, W is an at least partially fluorinated $C_1$ to $C_{10}$ alkyl and W' either has the same meaning as W or is a non-fluorinated $C_1$ to $C_{10}$ alkyl; and
(ii) bis(dialkylsiloxy)silanes.

2. The dielectric elastomer according to claim 1, wherein the degree of fluorination of the fluorinated silicone oil corresponds to the degree of fluorination of the three-dimensionally crosslinked, fluorinated, alkyl group-containing polysiloxane or deviates maximally by +/−10% therefrom, based on the number of fluorinated alkyl groups in the fluorinated silicone oil and the number of fluorinated alkyl groups in the three-dimensionally crosslinked, fluorinated, alkyl group-containing polysiloxane, respectively.

3. The dielectric elastomer according to claim 1, wherein the alkenyl group-containing polysiloxane molecule is a fluorinated dialkenyl(polysiloxane) copolymer with a molecular weight of at least 10,000 g/mol, comprising a building block —Si(W)(W')—O—, wherein W and W' are the same or different, W is an at least partially fluorinated $C_1$ to $C_{10}$ alkyl and W' either has the same meaning as W or is a non-fluorinated $C_1$ to $C_{10}$ alkyl.

4. The dielectric elastomer according to claim 3, wherein the fluorination degree of the fluorinated dialkenyl(polysiloxane) copolymer is at least 10% and/or wherein at least 10% of the hydrocarbon side groups at the Si atoms are fluorinated.

5. The dielectric elastomer according to claim 3, wherein the alkenyl-group containing polysiloxane molecule is a fluorinated dialkenyl(polysiloxane) copolymer with a molecular weight of at least 20,000 g/mol.

6. A dielectric elastomer comprising:
a film that contains or is comprised of a fluorinated silicone elastomer and has two faces;
a coating of a stretchable electrode material applied to each one of the two faces;
wherein the fluorinated silicone elastomer has a modulus of elasticity of maximally 450 kPa;
wherein the fluorinated silicone elastomer has been prepared by reaction of a fluorinated dialkenyl(polysiloxane) copolymer comprising building blocks —Si(W)(W')—O—, wherein W and W' are the same or different, W is an at least partially fluorinated $C_1$ to $C_{10}$ alkyl and W' either has the same meaning as W or is a non-fluorinated $C_1$ to $C_{10}$ alkyl, in a proportion of at least 50% relative to the number of building blocks with one Si atom and having a molecular weight of at least 10,000 g/mol, with two, or more than two, reactive groups with a fluorinated silane-containing crosslinker that contains three or more than three reactive groups, or wherein the fluorinated silicone elastomer has been prepared by reaction of the above fluorinated dialkenyl(polysiloxane) copolymer comprising building blocks with three, or more than three, reactive groups with a fluorinated siloxane that contains two, or more than two, reactive groups.

7. The dielectric elastomer according to claim 6, wherein the fluorinated dialkenyl(polysiloxane) copolymer carries no more than two reactive groups and the fluorinated silane-containing crosslinker carries no more than three reactive groups, or wherein the fluorinated dialkenyl(polysiloxane) copolymer carries no more than three reactive groups and the fluorinated siloxane no more than two reactive groups.

8. The dielectric elastomer according to claim 6, wherein the fluorinated dialkenyl(polysiloxane) copolymer has a molecular weight of at least 20,000 g/mol.

9. A dielectric elastomer comprising:
a film that contains or is comprised of a fluorinated silicone elastomer and has two faces;
a coating of a stretchable electrode material applied to each one of the two faces;
wherein the fluorinated silicone elastomer has a modulus of elasticity of maximally 450 kPa;
wherein the fluorinated silicone elastomer has been prepared by crosslinking of a fluorinated dialkenyl(polysiloxane) copolymer with trifluoropropyl tris(dimethylsiloxy)silane, optionally with extension of the polymer chains by addition of difluoropropyl bis(dimethylsiloxy)silane.

10. A method for producing a dielectric elastomer, the dielectric elastomer comprising a film that contains or is comprised of a fluorinated silicone elastomer and has two faces, further comprising a coating of a stretchable electrode material applied to each one of the two faces, wherein the fluorinated silicone elastomer has a modulus of elasticity of maximally 450 kPa, the method comprising the steps:
(a) providing an at least partially fluorinated polysiloxane that carries at least two reactive groups,
(b) providing an at least partially fluorinated silane or polysiloxane that carries at least three groups that can react with a reactive group of the at least partially fluorinated polysiloxane according to (a),
with the proviso that either the polysiloxane according to (a) or the silane or the polysiloxane according to (b) has a molecular weight of at least 10,000 g/mol,
(c) mixing the polysiloxane according to (a), the silane or the polysiloxane according to (b), a silicone oil and optionally a catalyst,
(d) applying a layer of the mixture produced according to (c) on a substrate,
(e) effecting a reaction of the reactive groups in the mixture by light and/or heat and/or the addition of a catalyst and forming a stable film,
(f) removing the film from the substrate,
(g) producing one or several mixtures comprising the materials of step (c) and an electrically conductive powder,
(h) applying the mixture produced according to (g) on a face of the film and either the same mixture or a different mixture produced according to (g) onto the other face of the film, and
(i) effecting the reaction of the reactive groups in the mixture by light and/or heat and/or the addition of a catalyst.

11. A method for producing a dielectric elastomer, the dielectric elastomer comprising a film that contains or is comprised of a fluorinated silicone elastomer and has two faces, further comprising a coating of a stretchable electrode material applied to each one of the two faces, wherein the fluorinated silicone elastomer has a modulus of elasticity of maximally 450 kPa, the method comprising the steps:
(a) providing an at least partially fluorinated polysiloxane that carries at least two reactive groups,
(b) providing an at least partially fluorinated silane or polysiloxane that carries three or more groups that can react with a reactive group of the polysiloxane according to (a),
(c) providing an at least partially fluorinated silane or polysiloxane that carries no more than two groups that can react with a reactive group of the polysiloxane according to (a),
with the proviso that at least one polysiloxane according to (a), (b) or (c) is provided that has a molecular weight of at least 10,000 g/mol,
(d) mixing of the polysiloxane according to (a), the silane or the polysiloxane according to (b), the silane or the polysiloxane according to (c), and optionally a catalyst,
(e) applying a layer of the mixture produced according to (d) on a substrate,
(f) effecting a reaction of the reactive groups in the mixture by light and/or heat and/or addition of a catalyst and forming a stable film,
(g) removing the film from the substrate,
(h) producing one or several mixtures comprising the materials of step (d) and an electrically conductive powder, (i) applying a mixture produced according to (h) on a face of the film and either the same mixture or a different mixture prepared according to (h) onto the other face of the film, and (k) effecting a reaction of the reactive groups in the mixture by light and/or heat and/or addition of a catalyst.

* * * * *